(12) United States Patent
Kim et al.

(10) Patent No.: US 6,292,420 B1
(45) Date of Patent: Sep. 18, 2001

(54) METHOD AND DEVICE FOR AUTOMATICALLY PERFORMING REFRESH OPERATION IN SEMICONDUCTOR MEMORY DEVICE

(75) Inventors: Kang Yong Kim; Saeng Hwan Kim; Jong Hee Han, all of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/604,300

(22) Filed: Jun. 26, 2000

(30) Foreign Application Priority Data

Jun. 29, 1999 (KR) .................................................. 11-25373

(51) Int. Cl.[7] ...................................................... G11C 7/00
(52) U.S. Cl. ..................... 365/222; 365/233; 365/230.08; 365/194; 365/185.05
(58) Field of Search ................................... 365/222, 223, 365/230.08, 194, 185.05

(56) References Cited

U.S. PATENT DOCUMENTS

| | | | |
|---|---|---|---|
| 5,304,868 | 4/1994 | Yokoyama et al. | 397/446 |
| 5,475,646 | 12/1995 | Ogihara | 365/222 |
| 5,619,457 | 4/1997 | Hayakawa et al. | 365/189.05 |
| 5,798,976 | 8/1998 | Arimoto | 365/222 |
| 5,812,490 | 9/1998 | Tgsukude | 365/233 |
| 5,889,712 | 3/1999 | Sugibayashi | 365/200 |
| 5,903,507 | 5/1999 | Arimot | 365/222 |
| 5,912,855 | 6/1999 | McLaury | 365/226 |
| 5,986,964 | * 11/1999 | Ariki et al. | 365/230.03 |
| 5,999,481 | * 12/1999 | Cowles et al. | 365/233 |
| 6,144,617 | * 11/2000 | Takai | 365/233.5 |

* cited by examiner

Primary Examiner—David Nelms
Assistant Examiner—Connie C. Yoha
(74) Attorney, Agent, or Firm—Nath & Associates PLLC; Gary M. Nath; Marvin C. Berkowitz

(57) ABSTRACT

The present invention discloses a method and a device for automatically performing a refresh operation, which can reduce power consumption in an auto refresh mode of a semiconductor memory device. The power consumption can be reduced by controlling the operation of input buffers or the operation of an input buffer generator for controlling the input buffers, during the auto refresh operation. The device for automatically performing the refresh operation in the semiconductor memory device, includes: a plurality of input buffers; an input buffer generator for controlling the operation of the plurality of input buffers; a command decoder for decoding a signal from one input buffer among the plurality of input buffers, and generating an auto refresh signal; a row active generator for generating a row active signal as the auto refresh signal is enabled; a delay generator for generating a delay signal delayed as long as a RAS cycle time according to the row active signal; and an auto refresh generator for controlling the plurality of input buffers by employing a control signal decided by the combination of the auto refresh signal from the command decoder and the delay signal from the delay generator.

9 Claims, 10 Drawing Sheets

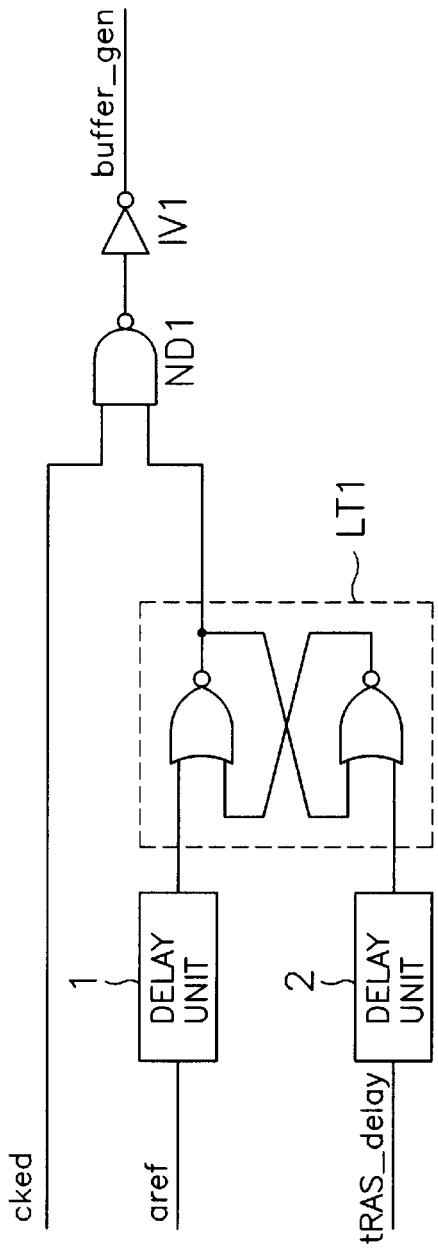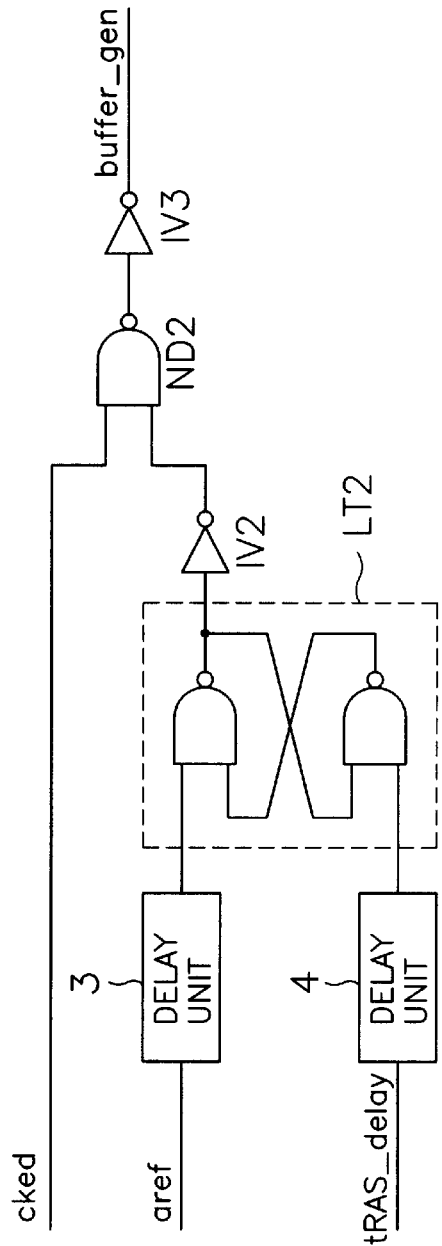

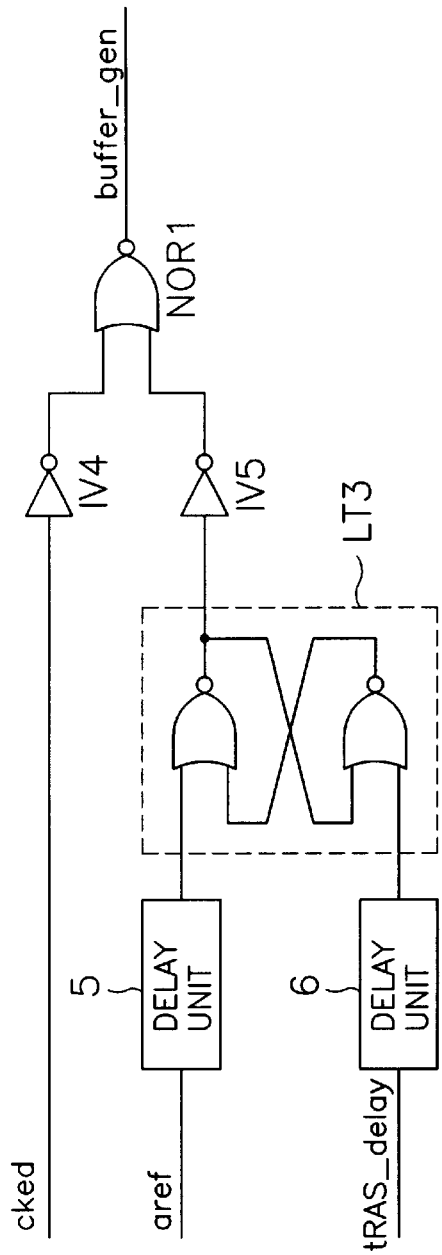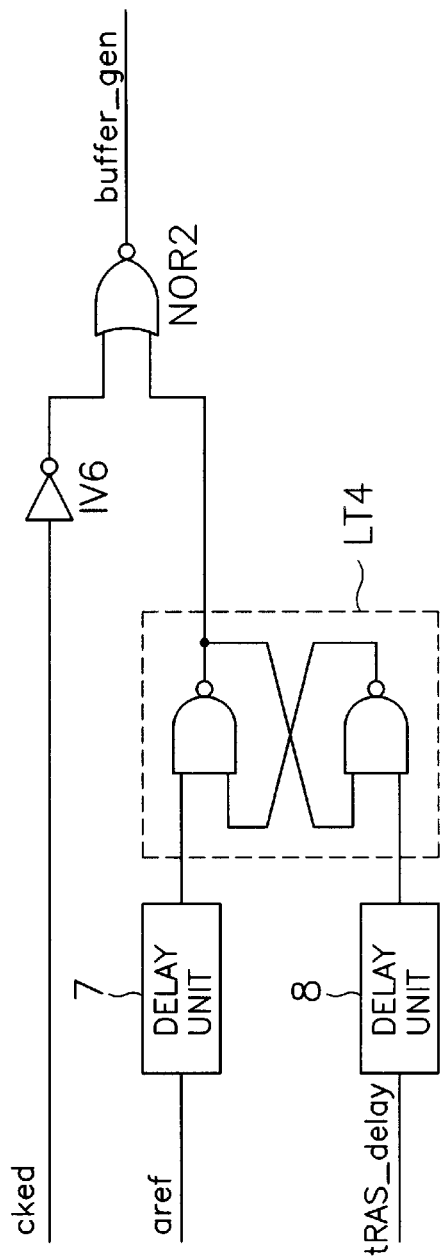

METHOD AND DEVICE FOR AUTOMATICALLY PERFORMING REFRESH OPERATION IN SEMICONDUCTOR MEMORY DEVICE

BACKGROUND OF THE INVENTION

The present invention relates to a method and a device for automatically performing a refresh operation in a semiconductor memory device, and in particular to a method and a device for automatically performing a refresh operation on a data of a memory cell in a semiconductor memory device such as a DRAM and a synchronous DRAM.

In order to stably maintain the data stored in the memory cell, the semiconductor memory device such as the DRAM and the SDRAM periodically or non-periodically carries out the refresh operation on the data according to a self refresh command or an auto refresh command.

FIG. 1 is a block diagram illustrating a structure of a conventional auto refresh circuit, and FIG. 2 is a timing diagram for explaining the generation of a buffer control signal according to a general clock enable signal.

A clock buffer 10 buffers an externally-inputted clock signal clk, and transmits it to an input buffer generator 14. A clock enable buffer 12 buffers an externally-inputted clock enable signal cke, and transmits it to the input buffer generator 14. When the semiconductor memory device reaches into a refresh mode, if the clock enable signal cke is at a high level, the auto refresh operation is performed. On the other hand, if the clock enable signal cke is at a low level, the self refresh operation is carried out.

The input buffer generator 14 receives signals from the buffers 10, 12, and outputs a control signal buffer_gen for enabling or disabling input buffers, such as a command buffer 16, an address buffer 24 and a data input buffer 26.

The command buffer 16 buffers the control signal buffer_gen from the input buffer generator 14 and externally-inputted signals, such as a TTL-level chip selection bar signal csb, a RAS bar signal rasb, a CAS bar signal casb and a write enable bar signal web, into a CMOS level in order to be internally used. A command decoder 18 decodes the signal from the command buffer 16. When the semiconductor memory device reaches into the auto refresh mode, the command decoder 18 transmits a signal aref having a predetermined level to a row active generator 20. Thereafter, a delay generator 22 receives a row active signal row_active from the row active generator 20, and transmits a signal rRAS_delay delayed as long as a RAS cycle time tRAS to the row active generator 20.

However, in general, the input buffers (command buffer 16, address buffer 24 and data input buffer 26) are turned on/off by the control signal buffer_gen generated in the input buffer generator 14 according to the state of the clock enable signal cke. Since the clock enable signal cke is at a high level in the auto refresh mode, the input buffers are normally operated.

When one input buffer is turned on, the current is a few tens μA to a few hundreds μA. One chip includes a few tens of input buffers. Accordingly, when the chip is in the refresh mode, the current flowing through the input buffer is a few mA to a few tens mA.

As a result, the input buffers receiving the external commands are unnecessarily operated in the auto refresh mode, which results in large power consumption.

SUMMARY OF THE INVENTION

Accordingly, it is an object of the present invention to provide a method and a device for automatically performing a refresh operation, which can reduce power consumption in an auto refresh mode of a semiconductor memory device.

In order to achieve the above-described object of the present invention, there is provided a method for automatically performing a refresh operation in a semiconductor memory device having a plurality of input buffers, including: a step for buffering externally-inputted signals; a step for decoding one of the buffered signals, and generating an auto refresh signal having a predetermined level; a step for receiving the auto refresh signal, and generating a row active signal; a step for receiving the row active signal, and generating a delay signal delayed as long as a RAS cycle time; and a step for controlling the operation of the plurality of input buffers by using a control signal decided by the combination of the auto refresh signal having a predetermined level and the delay signal.

There is also provided a device for automatically performing a refresh operation in a semiconductor memory device, including: a plurality of input buffers; a command decoder for decoding a signal from one input buffer among the plurality of input buffers, and generating an auto refresh signal having a predetermined level; a row active generator for generating a row active signal as the auto refresh signal is enabled; a delay generator for generating a delay signal delayed as long as a RAS cycle time according to the row active signal; and an input buffer generator for controlling the operation of the plurality of input buffers by employing a control signal decided by the combination of the auto refresh signal from the command decoder and the delay signal from the delay generator.

In addition, there is provided a device for automatically performing a refresh operation in a semiconductor memory device, including: a plurality of input buffers; an input buffer generator for controlling the operation of the plurality of input buffers; a command decoder for decoding a signal from one input buffer among the plurality of input buffers, and generating an auto refresh signal; a row active generator for generating a row active signal as the auto refresh signal is enabled; a delay generator for generating a delay signal delayed as long as a RAS cycle time according to the row active signal; and an auto refresh generator for controlling the plurality of input buffers by employing a control signal decided by the combination of the auto refresh signal from the command decoder and the delay signal from the delay generator.

BRIEF DESCRIPTION OF THE DRAWINGS

The present invention will become better understood with reference to the accompanying drawings which are given only by way of illustration and thus are not limitative of the present invention, wherein:

FIG. 4 is an inside circuit diagram illustrating one example of an input buffer generator in accordance with the present invention;

FIG. 5 is an inside circuit diagram illustrating a second example of the input buffer generator in accordance with the present invention;

FIG. 6 is an inside circuit diagram illustrating a third example of the input buffer generator in accordance with the present invention;

FIG. 7 is an inside circuit diagram illustrating a fourth example of the input buffer generator in accordance with the present invention;

DETAILED DESCRIPTION OF THE PREFERRED EMBODIMENTS

A method and a device for automatically performing a refresh operation in a semiconductor memory device in accordance with the present invention will now be described in more detail with reference to the accompanying drawings.

Figure 1:
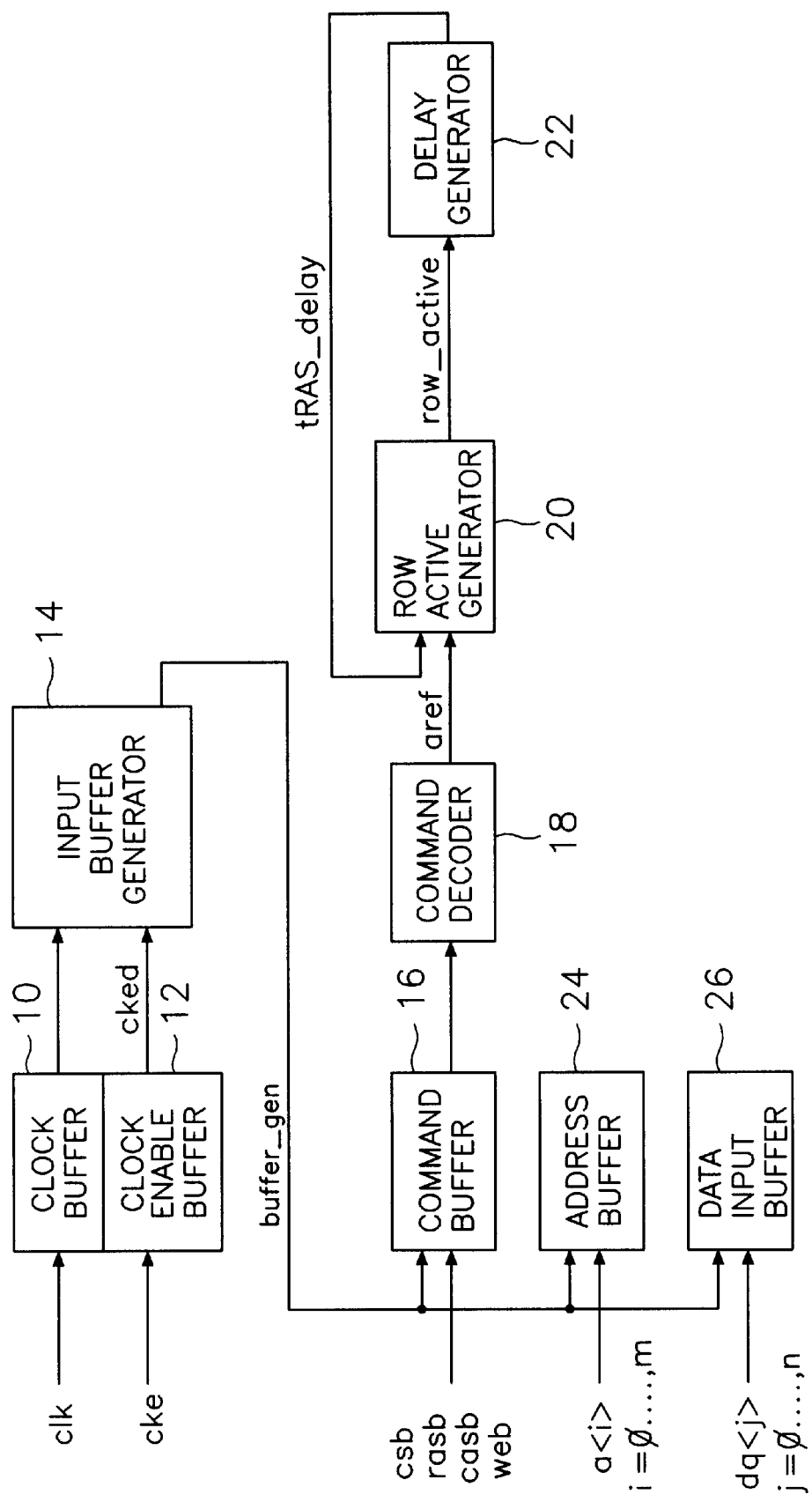
FIG. 1 is a block diagram illustrating a structure of a conventional auto refresh circuit.
Figure 2:
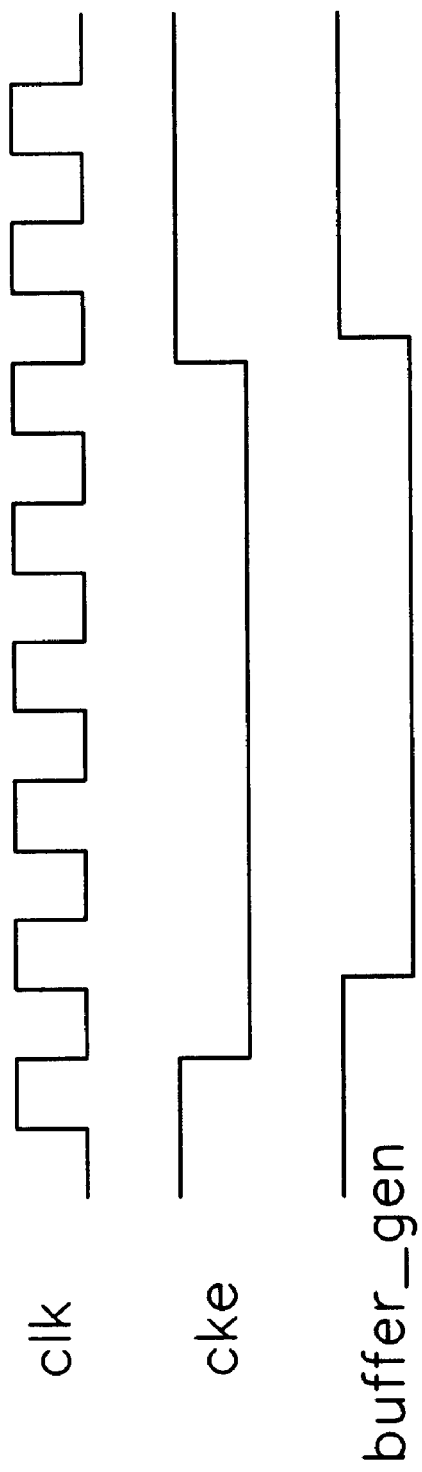
FIG. 2 is a timing diagram for explaining the generation of a buffer control signal according to a general clock enable signal.
Figure 3:
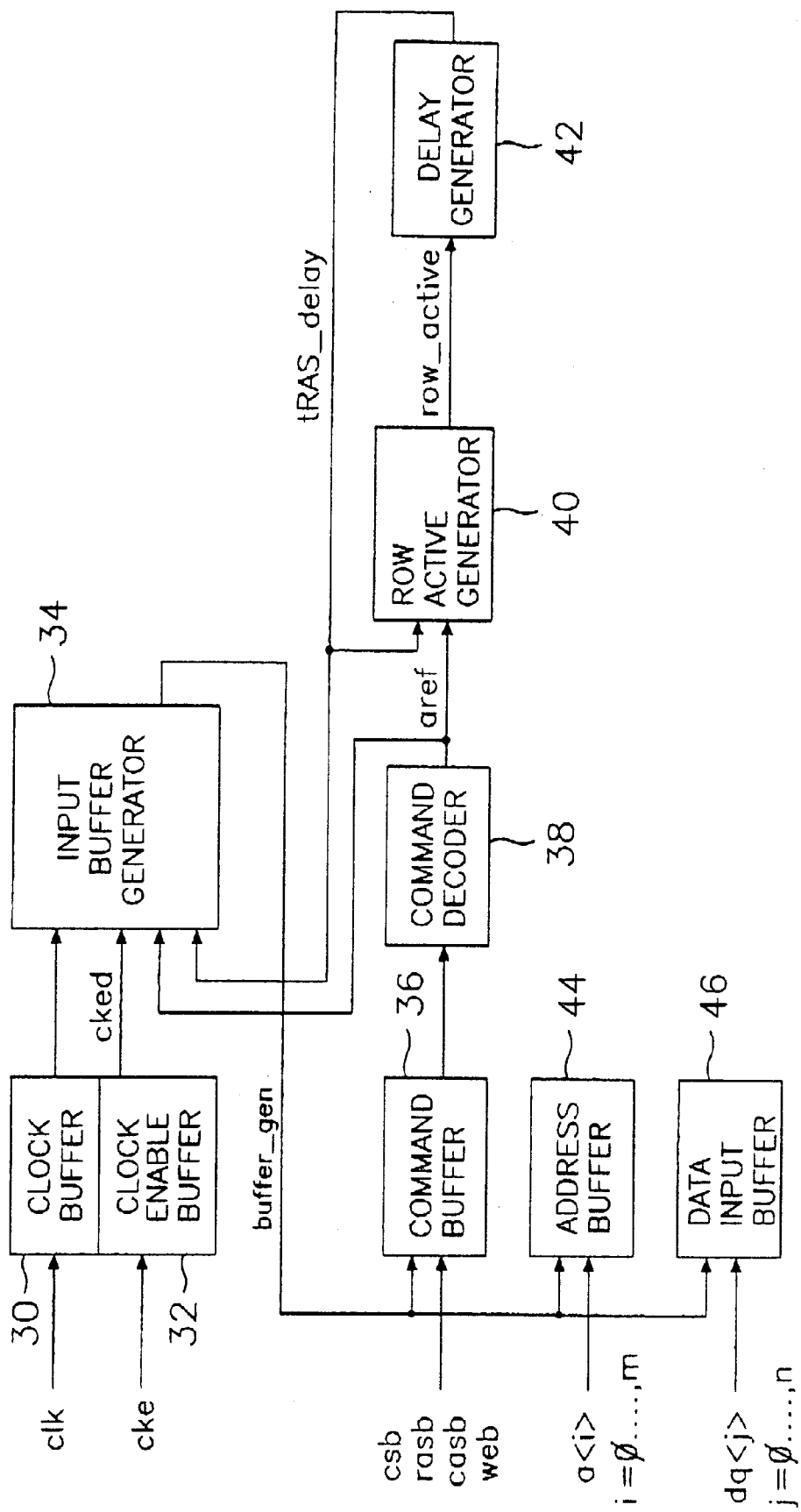
FIG. 3 is a block diagram illustrating a device for automatically performing a refresh operation in a semiconductor device in accordance with a first embodiment of the present invention.

FIG. 3 is a block diagram illustrating a device for automatically performing a refresh operation in a semiconductor device in accordance with a first embodiment of the present invention. A clock buffer 30 buffers an externally-inputted clock signal clk, and transmits it to an input buffer generator 34, as in the conventional art. A clock enable buffer 32 buffers an externally-inputted clock enable signal cke, and transmits it to the input buffer generator 34.

The input buffer generator 34 receives an auto refresh signal aref from a command decoder 38 which will be discussed later, and outputs a control signal buffer_gen for controlling a plurality of input buffers, such as a command buffer 36, an address buffer 44 and a data input buffer 46. The auto refresh signal is generated when the semiconductor memory device reaches into the auto refresh mode.

The command buffer 36 is controlled according to the control signal buffer_gen from the input buffer generator 34, and buffers externally-inputted signals, such as a TTL-level chip selection bar signal csb, a RAS bar signal rasb, a CAS bar signal casb and a write enable bar signal web, into a CMOS level in order to be internally used. The command decoder 38 decodes the signal from the command buffer 36. When the semiconductor memory device reaches into the refresh mode, the command decoder 36 transmits an auto refresh signal aref having a predetermined level to the input buffer generator 34 and a row active generator 40.

Thereafter, a delay generator 42 receives a row active signal row_active from the row active generator 40, and enables a delay signal tRAS_delay through a delay unit for compensating for the RAS cycle time tRAS. The delay signal tRAS_delay is returned to the row active generator 40 and the input buffer generator 34.

According to the preferred embodiments of the present invention, when the semiconductor memory device reaches into the auto refresh mode, the auto refresh signal aref and the row active signal row_active are internally enabled. The row active signal row_active is disabled after a predetermined time. The predetermined time is an internal delay tRAS_delay for the AC parameter that is the RAS cycle time tRAS.

In accordance with the preferred embodiments of the present invention, the input buffer generator 34 may be constituted as shown in FIGS. 4 to 7.

As illustrated in FIG. 4, the input buffer generator 34 includes: a delay unit 1 for receiving and delaying the auto refresh signal aref from the command decoder 38; a delay unit 2 for receiving and delaying the signal tRAS_delay from the delay generator 42; a NOR gate logic latch LT1 for latching the output signals from the delay units 1, 2; and NAND logics ND1, IV1 for receiving and NANDing the signal cked from the clock enable buffer 32 and the output signal from the latch LT1, and generating the final control signal buffer_gen.

For example, it is presumed that the input buffer generator 34 is at a high level when the auto refresh signal aref is enabled, and also presumed that the input buffer generator 34 is at a low level when the delay signal tRAS_delay is enabled. At this time, the delay unit 1 consists of the even number of inverters, and the delay unit 2 consists of the odd number of inverters.

As depicted in FIG. 5, the input buffer generator 34 includes: a delay unit 3 for receiving and delaying the auto refresh signal aref from the command decoder 38; a delay unit 4 for receiving and delaying the signal tRAS_delay from the delay generator 42; a NAND gate logic latch LT2 for latching the output signals from the delay units 3, 4; and NAND logics ND2, IV3 for receiving and NANDing an inverted signal of the output signal from the NAND gate logic latch LT2 by an inverter IV2, and generating the final control signal buffer_gen.

As illustrated in FIG. 6, the input buffer generator 34 includes: a delay unit 5 for receiving and delaying the auto refresh signal aref from the command decoder 38; a delay unit 6 for receiving and delaying the signal tRAS_delay from the delay generator 42; a NOR gate logic latch LT3 for latching the output signals from the delay units 5, 6; and a NOR gate NORI for receiving and NORing an inverted signal of the output signal cked from the clock enable buffer 32 by an inverter IV4 and an inverted signal of the output signal from the latch LT3 by an inverter IV5, and generating the final control signal buffer_gen.

Referring to FIG. 7, the input buffer generator 34 includes: a delay unit 7 for receiving and delaying the auto refresh signal aref from the command decoder 38; a delay unit 8 for receiving and delaying the signal tRAS_delay from the delay generator 42; a NAND gate logic latch LT4 for latching the output signals from the delay units 7, 8; a NOR gate NOR2 for receiving and NORing an inverted signal of the signal cked from the clock enable buffer 32 by an inverter IV6 and the output signal from the latch LT4, and generating the final control signal buffer_gen.

Figure 8:
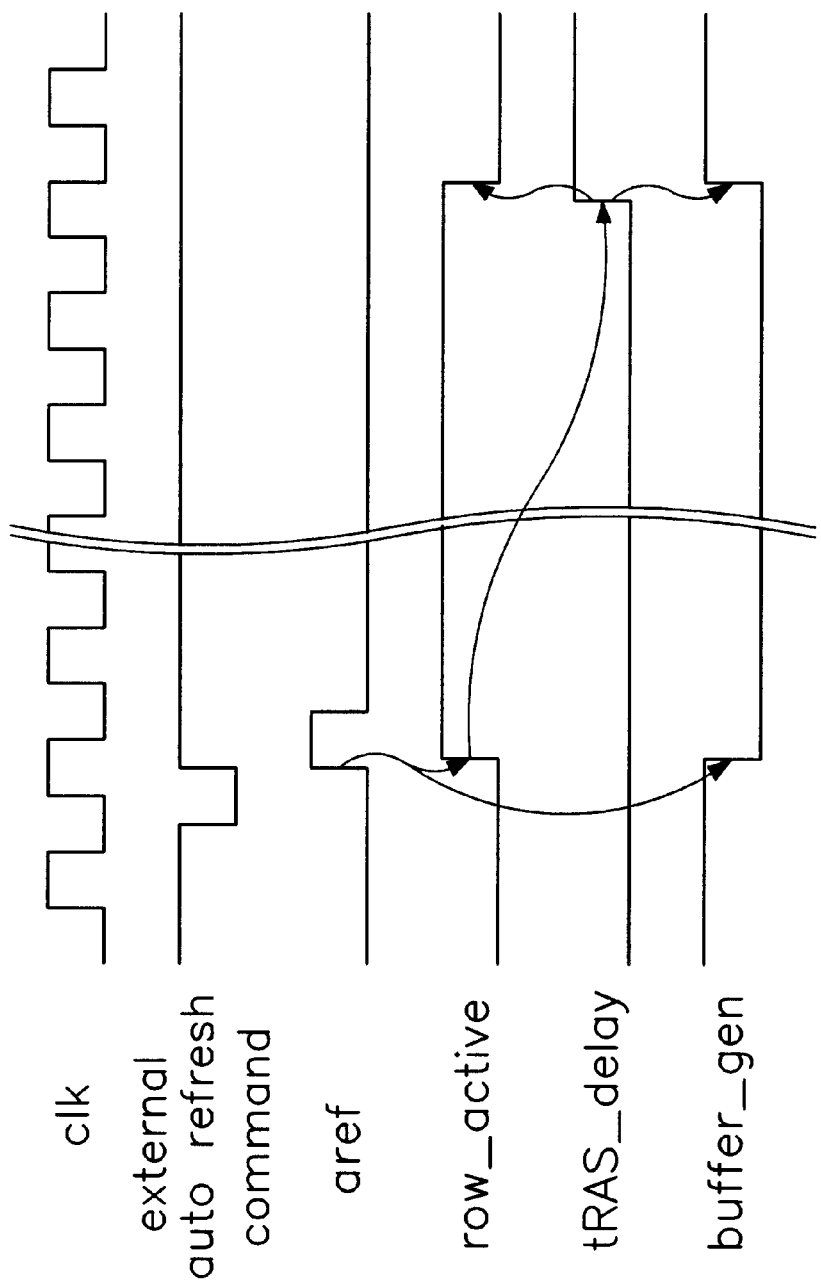
FIG. 8 is a timing diagram of the input buffer generator in accordance with the present invention.

The operation of the device for automatically performing the refresh operation in the semiconductor memory device according to the embodiment of the present invention as shown in FIG. 3 will now be explained with reference to the timing diagram of FIG. 8. The output signal aref from the command decoder 38 is enabled according to the external auto refresh command (namely, cke=high, csb=row, rasb=row, web=high). The row active generator 40 enables the row active signal according to the output signal aref. The output signal buffer_gen from the input buffer generator 34 is disabled. When the delay generator 42 receives the enabled row active signal row_active and enables the output signal tRAS_delay through the delay unit for compensating for the RAS cycle time tRAS, and when the input buffer generator 34 enables the output signal buffer_gen in order for the external auto refresh command to be inputted, the input buffers (command buffer 36, address buffer 44 and data input buffer 46) are turned on for the external command to be inputted after tRC.

Figure 9:
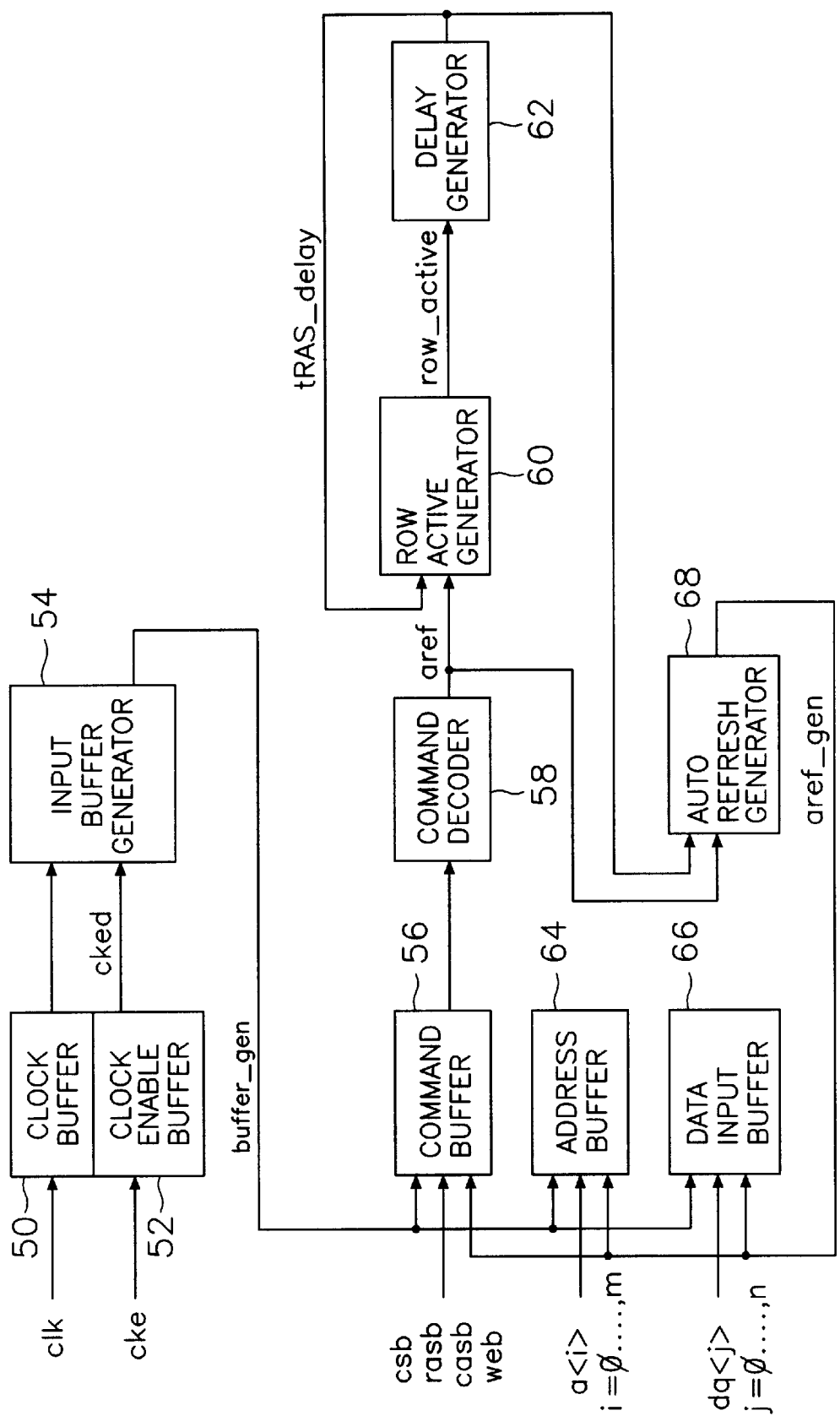
FIG. 9 is a block diagram illustrating a device for automatically performing a refresh operation in a semiconductor device in accordance with a second embodiment of the present invention.

FIG. 9 is a block diagram illustrating a device for automatically performing a refresh operation in a semiconductor device in accordance with a second embodiment of the present invention. The device of FIG. 9 is similar in constitution to the device of FIG. 3, but further includes an auto refresh generator 68. The auto refresh generator 68 receives the auto refresh signal aref from the command decoder 58 and the signal tRAS_delay from the delay generator 62, and generates the control signal aref-gen.

The control signal aref_gen is inputted to the input buffers (command buffer 56, address buffer 64, and data input buffer 66) for controlling the input buffers with the control signal buffer_gen from the input buffer generator 54.

That is, when both the control signal buffer_gen and the control signal aref_gen are enabled, the input buffers are enabled. In the case that one of the control signals buffer_gen, aref_gen is disabled, the input buffers are disabled.

Figure 10:
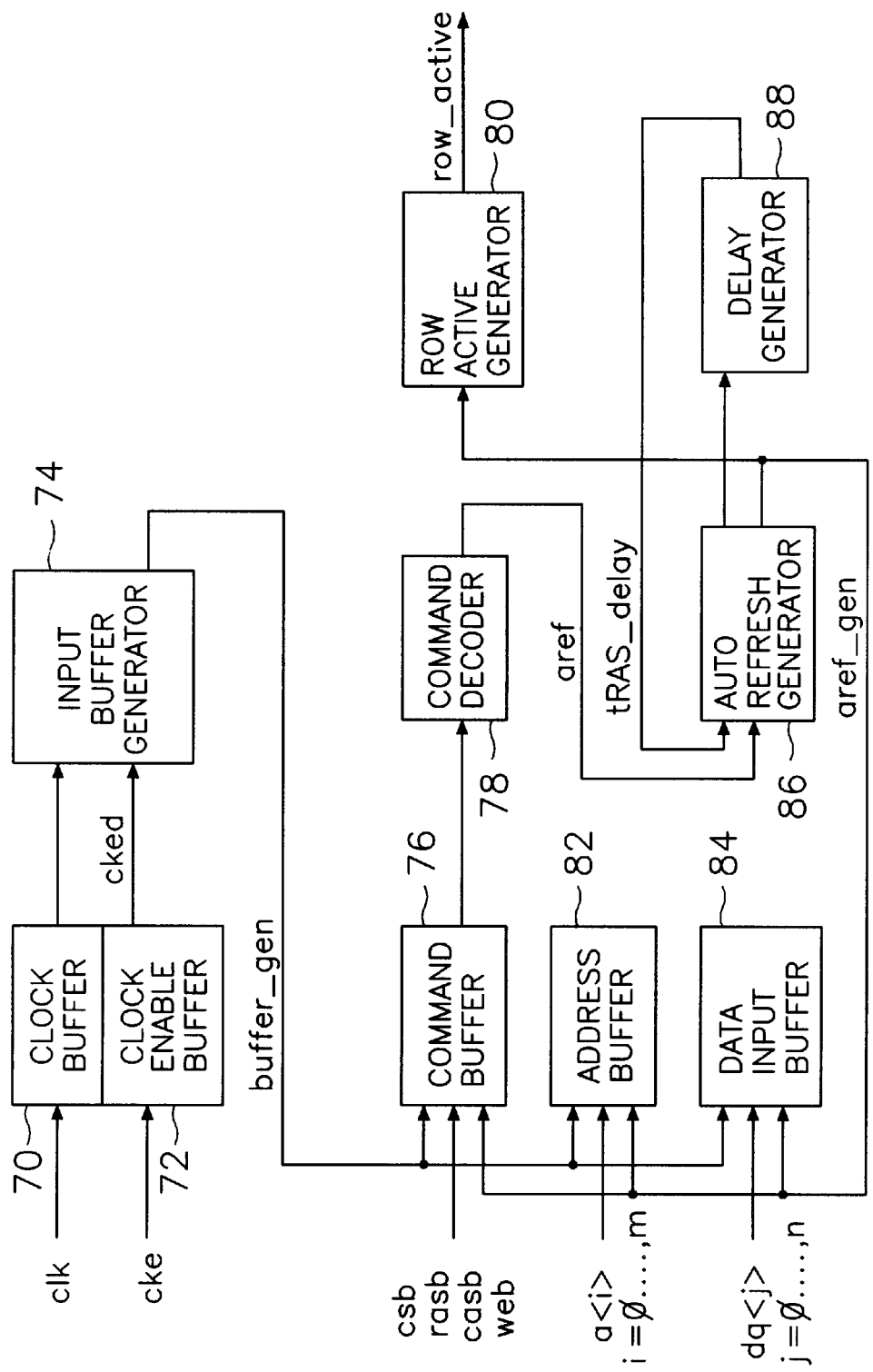
FIG. 10 is a block diagram illustrating a device for automatically performing a refresh operation in a semiconductor device in accordance with a third embodiment of the present invention.

FIG. 10 is a block diagram illustrating a device for automatically performing a refresh operation in a semiconductor device in accordance with a third embodiment of the present invention. The components of the device of FIG. 10 is identical in number to the components of the device of FIG. 9, but have different correlation.

That is, the auto refresh generator 86 receives the auto refresh signal aref from the command decoder 78, and outputs the enabled control signal aref-gen. Here, the auto refresh generator 86 enables a signal different from the control signal aref-gen, and transmits the signal to the delay generator 88. The control signal aref-gen may be used as the signal different from the control signal aref-gen.

As the signal is inputted to the delay generator 88, the output signal tRAS-delay passing through the delay unit is returned to the auto refresh generator 86, thereby disabling the output signal aref-gen from the auto refresh generator 86.

The control signal aref-gen is inputted to the input buffers (command buffer 76, address buffer 82, and data input buffer 84) and the row active generator 80, thereby controlling the circuits.

Figure 11:
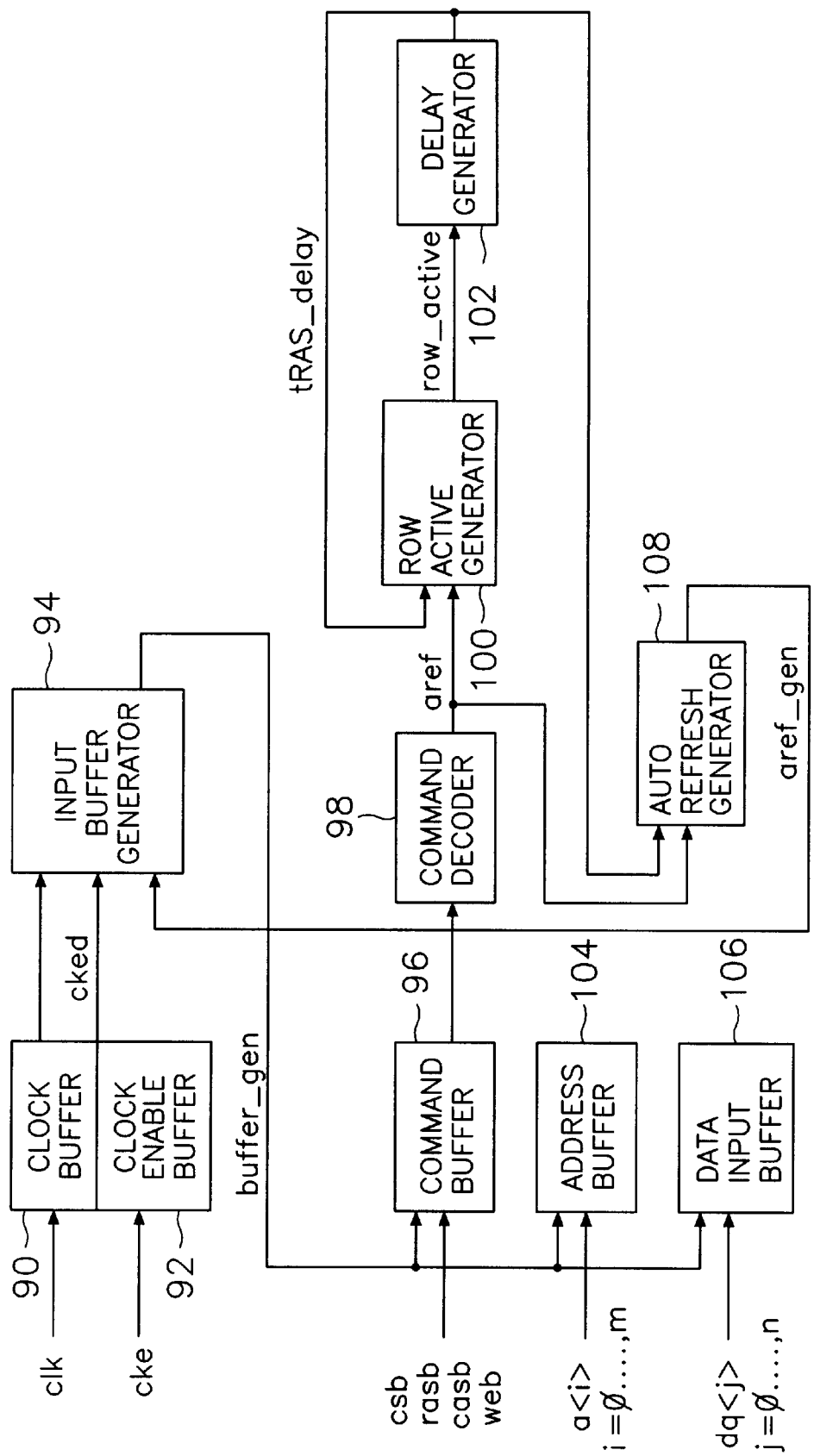
FIG. 11 is a block diagram illustrating a device for automatically performing a refresh operation in a semiconductor device in accordance with a fourth embodiment of the present invention.

FIG. 11 is a block diagram illustrating a device for automatically performing a refresh operation in a semiconductor device in accordance with a fourth embodiment of the present invention. The device of FIG. 11 is similar in constitution to the device of FIG. 9. However, in FIG. 9 the control signal aref-gen from the auto refresh generator 68 is inputted to the input buffers (the command buffer 56, address buffer 64 and data input buffer 66), while in FIG. 11 the control signal aref-gen is inputted to the input buffer generator 94 for controlling its output signal buffer-gen.

In FIG. 11, when the clock enable signal cke is at a low level or when the control signal aref-gen is enabled, the control signal buffer-gen outputted from the input buffer generator 94 is disabled, and accordingly the input buffers (command buffer 96, address buffer 104 and data input buffer 106) are disabled. The control signal buffer-gen is enabled.

Figure 12:
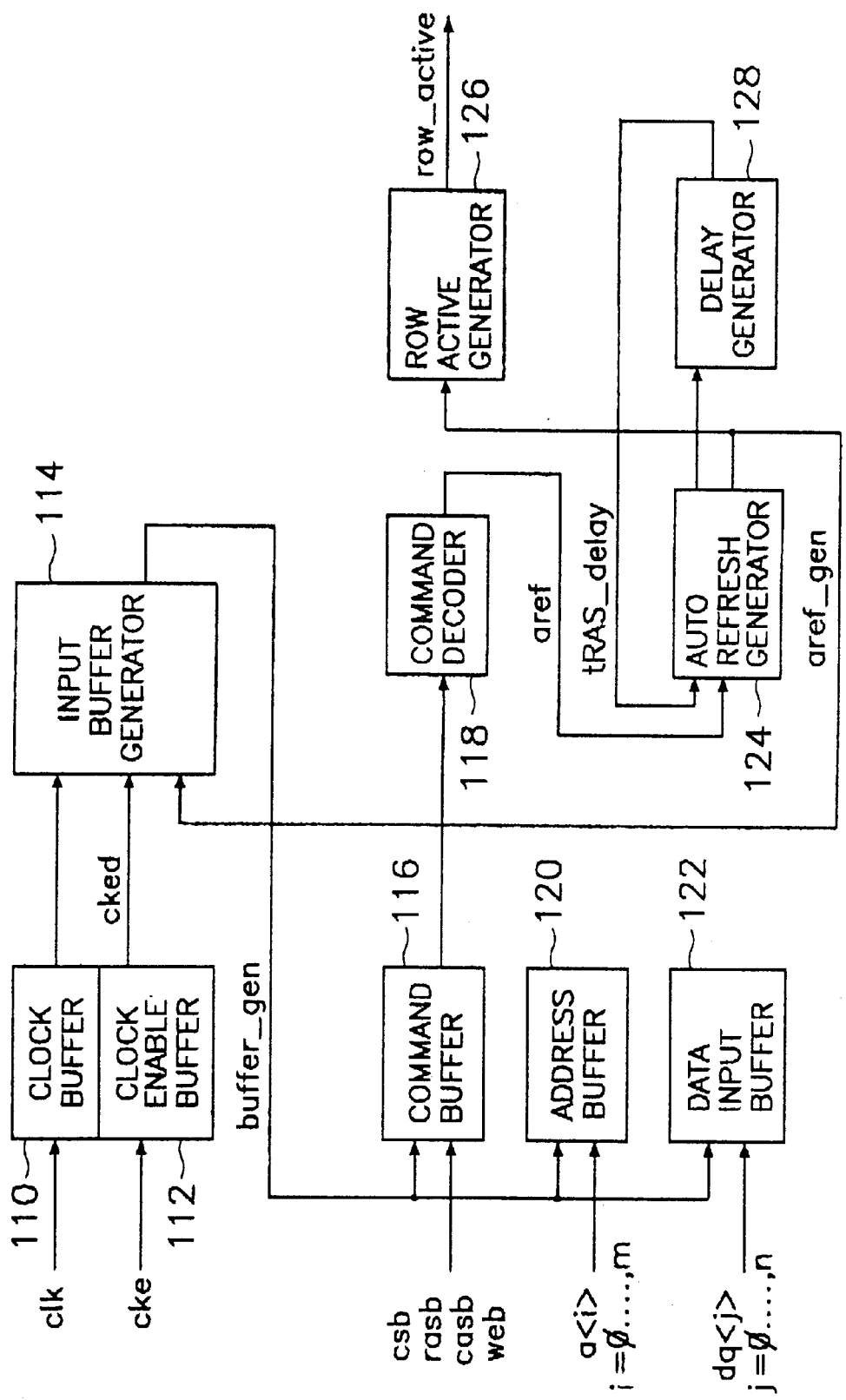
FIG. 12 is a block diagram illustrating a device for automatically performing a refresh operation in a semiconductor device in accordance with a fifth embodiment of the present invention.

FIG. 12 is a block diagram illustrating a device for automatically performing a refresh operation in a semiconductor device in accordance with a fifth embodiment of the present invention. The device of FIG. 12 is almost identical in constitution to the device of FIG. 10. However, in FIG. 10 the control signal aref-gen from the auto refresh generator 86 is inputted to the input buffers (the command buffer 76, address buffer 82 and data input buffer 84), while in FIG. 12 the control signal aref-gen is inputted to the input buffer generator 114 for controlling its output signal buffer-gen, and to the row active generator 126.

In FIG. 12, the auto refresh generator 124 receives the auto refresh signal aref from the command decoder 118, and outputs the enabled control signal aref-gen. At this time, the auto refresh generator 124 enables a signal different from the control signal aref-gen, and transmits the signal to the delay generator 128. The control signal aref-gen may be used as the signal different from the control signal aref-gen.

As the signal is inputted to the delay generator 128, the output signal tRAS_delay passing the delay unit is returned to the auto refresh generator 124, thereby disabling the output signal aref-gen from the auto refresh generator 124.

The control signal buffer-gen is inputted to the input buffers (command buffer 116, address buffer 120 and data input buffer 122).

As discussed earlier, the present invention controls the operation of the input buffers or the operation of the input buffer generator for controlling the input buffers, during the auto refresh operation, thereby reducing the power consumption.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for automatically performing a refresh operation in a semiconductor memory device having a plurality of input buffers, comprising:

a step for buffering externally-inputted signals;

a step for decoding one of the buffered signals, and generating an auto refresh signal having a predetermined level;

a step for generating a row active signal which is enabled or disabled in response to the auto refresh signal;

a step for generating a delay signal delayed as long as a RAS cycle time in response to the row active signal;

a step for generating a control signal for controlling the plurality of input buffers by combining clock signals from a clock buffer and a clock enable buffer among the plurality of input buffer, the auto, refresh signal, and the delay signal; and a step for disabling the operation of the plurality of input buffers in an auto refresh mode by using the control signal which is enabled or disabled in response to the auto refresh signal and the delay signal.

2. A device for automatically performing a refresh operation in a semiconductor memory device, comprising:

a plurality of input buffers;

a command decoder for decoding a signal from one input buffer among the plurality of input buffers, and generating an auto refresh signal having a predetermined level;

a row active generator for generating a row active signal which is enabled or disabled in response to the auto refresh signal;

a delay generator for generating a delay signal delayed as long as a RAS cycle time according to the row active signal, and returning the delay signal to the row active generator; and an input buffer generator for generating a control signal by the combination of the auto refresh signal, the delay signal, and clock signals from a clock buffer and a clock enable buffer among the plurality of input buffers, and then controlling the operation of the plurality of input buffers by employing the control signal which is enabled or disabled in response to the auto refresh signal and the delay signal, the plurality of input buffer are disabled by the control signal in an auto refresh mode.

3. The device according to claim 2, wherein the input buffer generator comprises:

a first delay unit for receiving and delaying the auto refresh signal from the command decoder;

a second delay unit for receiving and delaying the delay signal from the delay generator;

a NOR gate logic latch circuit for latching output signals from the first and second delay units; and a logic circuit for receiving the clock signal from the clock enable buffer and an output signal from the latch circuit, and generating a final control signal.

4. The device according to claim 2, wherein the input buffer generator comprises:

a third delay unit for receiving and delaying the auto refresh signal from the command decoder;

a fourth delay unit for receiving and delaying the delay signal from the delay generator;

a NAND gate logic latch circuit for latching output signals from the third and fourth delay units; and a logic circuit for receiving the clock signal from the clock enable buffer and an inverted signal of an output signal from the latch circuit by an inverter, and generating a final control signal.

5. The device according to claim 2, wherein the input buffer generator comprises:

a fifth delay unit for receiving and delaying the auto refresh signal from the command decoder;

a sixth delay unit for receiving and delaying the delay signal from the delay generator;

a NOR gate logic latch circuit for latching output signals from the fifth and sixth delay units; and a logic circuit for receiving an inverted signal of the clock signal from the clock enable buffer by an inverter and an inverted signal of an output signal from the latch circuit by an inverter, and generating a final control signal.

6. The device according to claim 2, wherein the input buffer generator comprises:

a seventh delay unit for receiving and delaying the auto refresh signal from the command decoder;

an eighth delay unit for receiving and delaying the delay signal from the delay generator;

a NAND gate logic latch circuit for latching output signals from the seventh and eighth delay units; and a logic circuit for receiving an inverted signal of the clock signal from the clock enable buffer by an inverter and an output signal from the latch circuit, and generating a final control signal.

7. A device for automatically performing a refresh operation in a semiconductor memory device, comprising:

a plurality of input buffers;

an input buffer generator for generating a first control signal by the combination of clock signals from a clock buffer and a clock enable buffer among the plurality of input buffers, and controlling the operation of the plurality of input buffers by using the first control signal;

a command decoder for decoding a signal from one input buffer among the plurality of input buffers, and generating an auto refresh signal;

a row active generator for generating a row active signal which is enabled or disabled in response to the auto refresh signal;

a delay generator for generating a delay signal delayed as long as a RAS cycle time in response to the row active signal, and returning the delay signal to the row active generator; and an auto refresh generator for generating a second control signal by the combination of the auto refresh signal and the delay signal, and controlling the plurality of input buffers by employing the second control signal which is enabled or disabled in response to the auto refresh signal and the delay signal;

the plurality of input buffers are disabled by the first and second control signals in an auto refresh mode.

8. The device according to claim 7, wherein the auto refresh generator controls the operation of the row active generator when controlling the plurality of input buffers by using the second control signal.

9. The device according to claim 7, wherein the input buffers generator controls the operation of the plurality of input buffer by employing the first control signal generated by the combination of the clock signals and the second control signal.

* * * * *